Figure 1:
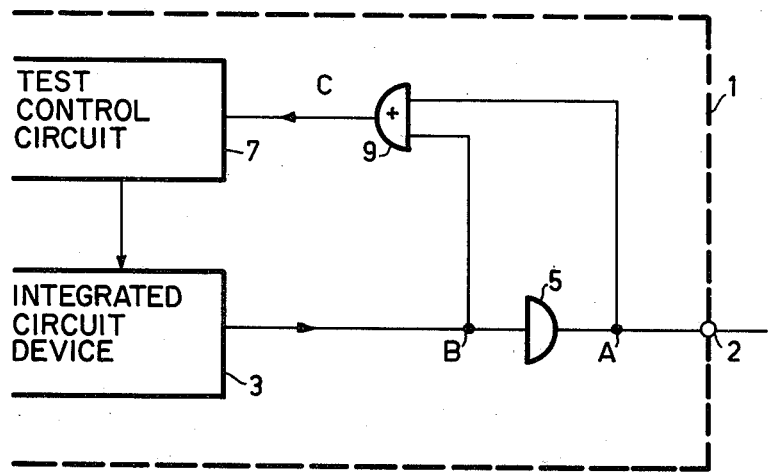

United States Patent [19]

Delvigne

[11] 4,385,275

[45] May 24, 1983

[54] METHOD AND APPARATUS FOR TESTING AN INTEGRATED CIRCUIT

[75] Inventor: Josephus Delvigne, Hamburg, Fed. Rep. of Germany

[73] Assignee: U.S. Philips Corporation, New York, N.Y.

[21] Appl. No.: 142,293

[22] Filed: Apr. 21, 1980

[30] Foreign Application Priority Data

Apr. 27, 1979 [DE] Fed. Rep. of Germany ....... 2917126

[51] Int. Cl.³ ............................................. G01R 15/12
[52] U.S. Cl. ................................................. 324/73 R
[58] Field of Search ......................... 324/73 R, 73 PC

[56] References Cited

U.S. PATENT DOCUMENTS 4,176,258 11/1979 Jackson ............................ 324/73 R Primary Examiner—Gerard R. Strecker
Assistant Examiner—Walter E. Snow
Attorney, Agent, or Firm—Paul R. Miller

[57] ABSTRACT

In order to set the circuit to be tested to a test mode, at least one output is led out by an output stage, and the input and output of the output stage internally leads to an exclusive-OR gate. As long as the output has a comparatively high-ohmic termination, as is the case during the normal mode of operation, the exclusive-OR gate will carry the same signal for both signal conditions of the output. For the purpose of testing a complementary pulse pattern is applied to the output, so that the exclusive-OR gate supplies an opposite signal, which establishes the test mode. The output of the exclusive-OR gate may lead to a bistable multivibrator, so that for establishing the test mode only a single complementary signal is required.

5 Claims, 5 Drawing Figures

METHOD AND APPARATUS FOR TESTING AN INTEGRATED CIRCUIT

The invention relates to a method of testing an integrated circuit, which generates at least one digital output signal, the circuit being set to a test mode by means of an externally applied signal, and also to an arrangement for carrying out the method.

When testing highly complex integrated circuits with sequential logic, i.e. with memory circuits, the problem occurs that testing all possible states takes too much time. In order to speed up testing, it is therefore effective to test the individual sections or blocks of the circuit separately. However, as especially in the case of integrated circuits accommodated in a casing the internal circuit points are no longer accessible, the additional test points should be lead out. However, this increases the number of connecting elements of the integrated circuit. This number is limited when standard casing types are employed. Therefore, it is known to set the circuit to a test mode by means of an externally applied signal, in which mode the individual inputs or outputs of the integrated circuit are practically directly connected to the input and output connections of the circuit. However, also in this case an additional connection is necessary, which is not available for use as a signal connection during normal operation.

It is the object of the invention to provide a method of the type mentioned in the preamble, which requires no additional connection for setting the circuit to the test mode. According to the invention this object is achieved in that the digital signal is fed out by an output stage, whose input and output, within the circuit, are connected to a logic circuit which evaluates the combination of signal conditions and controls the test mode, and that for setting the test mode a signal pattern, which is complementary to the time signal pattern to be generated, is applied to the digital-signal output. In this way a normal signal output is also employed as signal input for the test signal. Obviously, the output stage should then be designed so that the output signal can externally be set to the opposite signal value without the stage being damaged. In an embodiment to be described hereinafter this should apply to at least the one signal value.

An arrangement for carrying out the method in accordance with the invention is characterized in that the logic circuit is an exclusive OR-gate, whose output is connected to the control input of a test control circuit which, if a non-inverting stage is employed as output stage, is set to the test mode by a logic "0" and, if an inverting stage is employed as output stage, by a logic "1" on the control input. In this way a very simple design of the logic circuit is realized.

An embodiment of this arrangement is characterized in that the test control circuit comprises a bistable multivibrator which is controlled by the signal on the control input. In this way it is possible that only one external signal, instead of a pattern comprising a sequence of signals, is to be applied in order to set the circuit to the test mode. A further externally applied complementary signal then resets the bistable multivibrator and thus the circuit to the normal operating condition.

Figure 2:
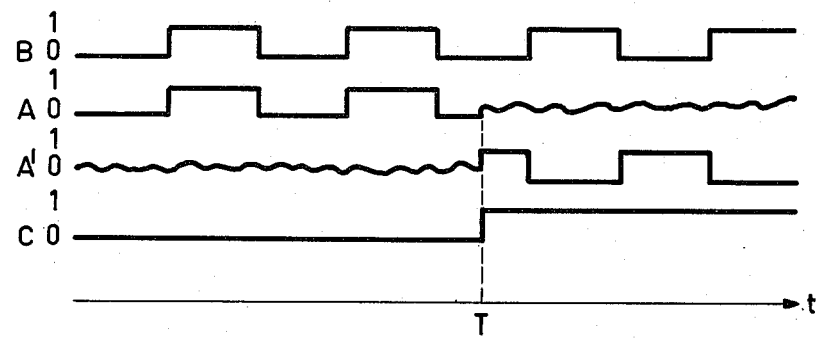
Figure 3:
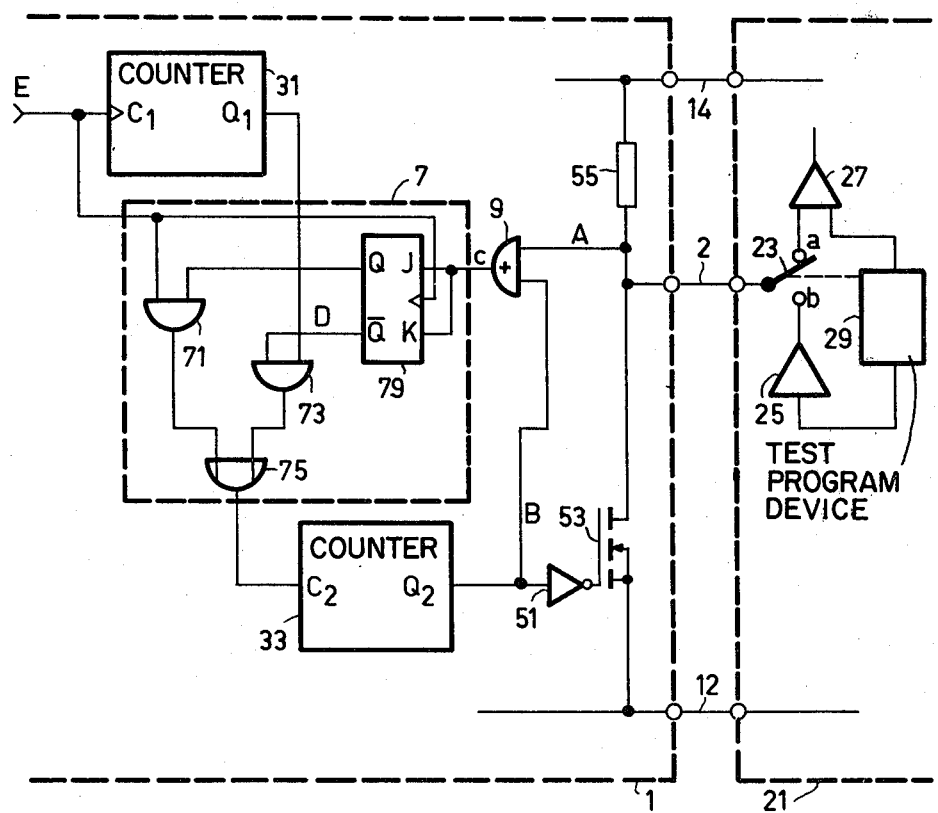
Figure 4:
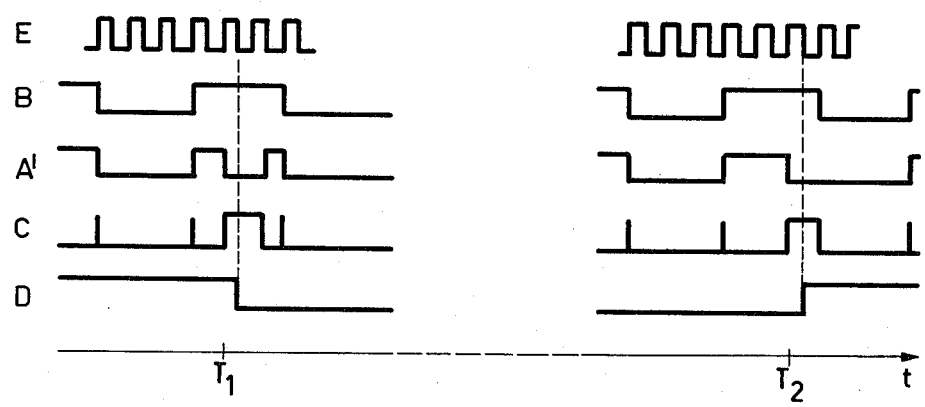
Figure 5:
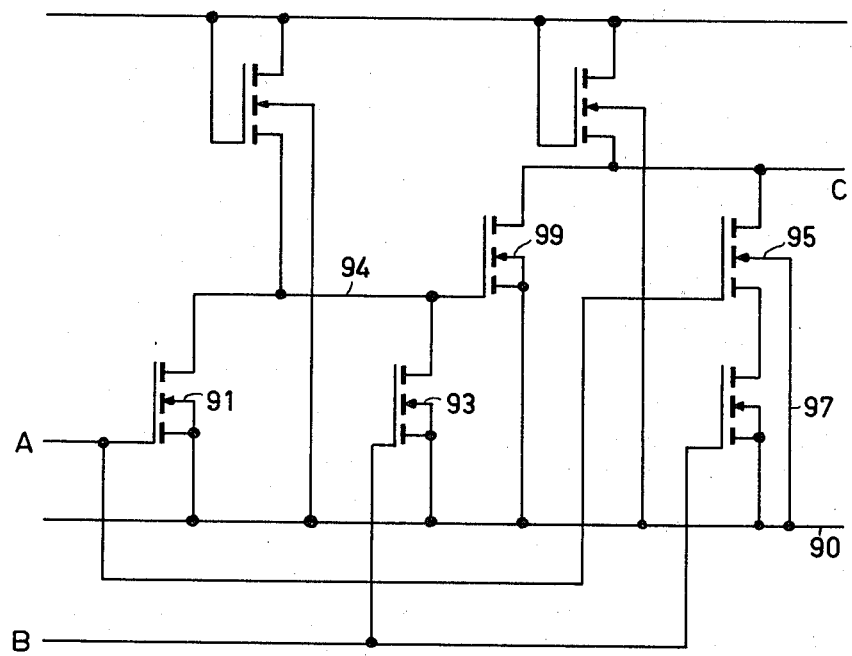

Embodiments of the invention will be described in more detail with reference to the drawing. In the drawing:

FIG. 1 represents the basic set-up of an arrangement in accordance with the invention in the integrated circuit, FIG. 2 represents a time diagram associated therewith, FIG. 3 represents a further embodiment of an arrangement and how it is connected to a test device, FIG. 4 represents a waveform diagram associated therewith, FIG. 5 is an example of the logic circuit in NMOS technology.

In FIG. 1 the area surrounded by the dashed frame 1 represents a device with an integrated circuit, in which for the sake of simplicity only a single connection 2 is shown as output. The device 1 comprises a circuit 3, which performs the actual functions of the device. For the sake of simplicity only one output of the circuit 3 is shown, which is connected to the input of an output stage 5 and to a logic circuit 9 at a point designated B. The output of the output stage 5 is connected to the output 2 of the device 1 and internally to a further input of the logic circuit 9, which line is designated A. The output of the logic circuit 9, which is designated C, leads to the input of a test control circuit, which in the test mode switches the circuit 3 to another mode of operation. Suitably, all circuits or circuit sections in the device 1 are together integrated on a single semiconductor chip.

The operation of the arrangement shown in FIG. 1 will be described in more detail with reference to FIG. 2. It is assumed that, as a result of signals applied to inputs not shown, the circuit 3 produces the signal waveform on the output line B shown on the corresponding line of FIG. 2. As long as no external signal is applied to the output 2 of the device 1, a similar signal will appear on the output and thus on the line A, because the output stage 5 is non-inverting. The line A' represents the external signal applied to the output 2, the undulating line at the beginning indicating that this signal is not available, i.e. that the source generating this signal is high-ohmic for the time being. Since both the lines A and B carry the same signal, the exclusive-OR gate 9 will produce a low signal on the line C.

At the instant T a signal is applied to the output 2, which is opened to the signal B and thus to the signal from the output stage 5 with open-circuited output 2. In order to indicate that the signal on output 2 is determined by the external signal source, the signal waveform of the line A' in FIG. 2 is represented by straight lines and the signal A from the output stage 5 as an undulating line. As will be apparent from a comparison of the lines B and A', the logic circuit 9 now receives different signals on the input, so that on the output line C a high signal is produced, which sets the test control circuit 7 to the test mode.

As soon as the signal applied to output 2 disappears again, i.e. the corresponding signal source becomes high-ohmic, the logic circuit 9 again receives equal signals and thus produces a low signal on the line C, which resets the test control circuit 7 to the normal mode of operation.

In the embodiment which is represented in greater detail in FIG. 3 the electronic device 1 is connected to a test circuit 21, namely by the two power supply lines 12 and 14 and the output line 2. Further input and output lines of the device 1 are generally also connected to the test circuit 21, but are not shown in FIG. 3 for the sake of clarity.

In this case the circuit for carrying out the desired functions of the device 1, comprises two counters 31 and 33, which divide the frequency of a clock signal applied to input E by the values K and L. The output $Q_2$ of the counter 33 is followed by an output stage, which comprises an inverter 51, a N-channel field-effect transistor 53 and a load resistor 55, which resistor generally also takes the form of a field-effect transistor. The output line A from the junction point of transistor 53 with the resistor 55 leads both to the output 2 and to an input of the exclusive-OR gate 9, whose other input is connected directly to the line B, i.e. to the output $Q_2$ of the counter 33.

The output 2 of the device 1 leads to a switch 23 in the test circuit 21, which switch connects the output to a comparator 27 in position a and to the output of a driver stage 25 in position b. The switch 23 is controlled by a device 29, which receives the test control program and which also supplies the signals for controlling the driver stage 25 and the comparator 27.

The two counters 31 and 33 in the device 1 are connected to each other by the test control circuit 7. This test control circuit comprises a JK flip-flop 79, whose J and K inputs are both connected to the output of the exclusive-OR gate 9 by the line C. As a result of this the flip-flop 79 changes over upon each signal on the clock input if the exclusive-OR gate 9 supplies a high signal. The clock input receives the clock signal applied to input E, while it is assumed that the flip-flop 79 changes over upon the opposite clock-signal edge as the counters 31 and 33, which is indicated by the point before the clock input. When the signal on output $Q_2$ of the counter 33 changes as a result of a clock signal, this change is transferred to the exclusive-OR gate 9 directly by the line B and with a delay equal to the propagation delay of the inverter 51 and the transistor 53 by the line A, so that during this time the exclusive OR-gate 9 receives different signals and can generate short positive pulses, as is represented by line C in FIG. 4. These pulses, which practically represent spurious pulses, have ceased when the other edge of the clock signal occurs, so that the flip-flop 79 cannot be changed over erroneously. In the rest condition the upper output $\bar{Q}$ may carry a high signal, which can be achieved by means of a corresponding reset input, which is connected to the general reset line of the device. This is the normal operating condition of the test control circuit 7. By the line D the $\bar{Q}$ output is connected to an input of an AND-gate 73, whose other input is connected to the output $Q_1$ of the counter 31 and whose output is connected to an input of the OR-gate 75. As a result of this the clock signal, which is applied to the clock input $C_1$ of the counter 31 by the input E and which appears on output $Q_1$ with a reduced frequency, reaches the clock input $C_2$ of the counter 33 by the AND-gate 73 and the OR-gate 75 and is then further reduced. If the counters 31 and 33 have greater dividing ratios, for example as in electronic clocks, where minutes and hours are displayed, while the clock input is of the order of magnitude of the maximum permissible clock frequency, it will be evident that for a complete test of all stages of all counters a very long time would be needed.

In order to enable the counter 33 to be tested directly, i.e. independently of the counter 31, the input E is also connected to an input of an AND gate 71, whose other input is connected to the Q-output of the flip-flop 79. The output of the AND-gate 71 is connected to the clock input $C_2$ of the counter 33 by the OR-gate 75. By this path the counter 33 can be controlled directly by the clock signal on input E.

In order to achieve this the switch 23 in the test device 21 is set to position b at instant $T_1$ and by the driver stage 25 a low signal is applied to the output line 2, which at this instant is high, as shown in FIG. 4. This signal should begin sufficiently long before the trailing edge of the relevant clock signal, in order to ensure that the exclusive-OR gate 9 receives two different signals for a correspondingly long time and generates a long output signal, ensuring that the flip-flop 79 changes over on the trailing edge of the clock signal. The $\bar{Q}$ output and thus the line D then become low and AND gate 73 is blocked, while the Q output carries a high potential and enables the AND gate 71. By the AND-gate 71 and the OR-gate 75 the clock signal on input E thus directly reaches the clock input $C_2$ of the counter 33 and can advance the counter with the maximum permissible clock frequency, so that the counter can pass through all counter positions within a short time, which can be ascertained by means of the signals on the output $Q_2$, which appear on the output 2 by the inverter stage 51 and the output transistor 53. In the meantime the switch 23 has been set to position a, the signals are compared with corresponding signals from the test program device 29 in the comparator 27. In the case of a deviation the comparator 27 will supply an output signal, which is applied to a display device, not shown, or a device for subsequently sorting out the device 1 just tested.

In this example it has been assumed that the signal applied to the line 2 by the test device 21 is a negative signal, because in this situation the transistor 53 is cut off and the line 2 then appears with an internal resistance equal to the value of the resistor 55. In this case the transistor 53 may take the form of a transistor having a low internal resistance in the conductive state. However, if also positive signals are to be applied to the line 2, the transistor 53 should have a limited internal resistance by a suitable geometry, in order to ensure that the current remains within limits for the applied positive signal.

When the counter 33 has been tested, switch 23 is set to position b at the instant $T_2$ and the driver stage 25 is driven so as to produce a negative signal, as is shown in FIG. 4. Thus, the exclusive-OR gate 9 will temporarily receive two different input signals, so that a pulse is produced in line C, which again changes over the flip-flop 79, so that the line D again becomes high. The AND gate 71 is then blocked and the AND gate 73 is enabled, so that now the two counters 31 and 33 are connected in series again and the normal operating condition is restored.

The example of an exclusive-OR gate shown in FIG. 5 is realized in MOS technology, all transistors being N-channel enhancement-type field-effect transistors, which are turned on only by a high potential on the gate connection. The arrows represent the substrate connection, which is connected to the line 90 at reference potential. The two transistors connected to the line 96 for the positive supply voltage are load transistors, which operate as load resistors. The input signals are applied by the lines A and B and the output signal is available on line C. When the lines A and B have a low signal, the two transistors 91 and 93 are cut off, so that the line 94 is positive and transistor 99 is turned on. The signal on the line C is then low. When the two lines A and B carry a positive signal, the transistors 91 and 93 are conductive, so that the line 94 is practically at the potential of the reference line 90 and transistor 99 is thus cut off, but the two transistors 95 and 97 are now turned on, as a result of which the line C also has a low potential. However, if only one of the two lines A and B has a high potential and the other a low potential, one of the transistors 91 and 93 will be turned on, so that the line 94 will practically have the potential of the line 90 and transistor 99 is cut off, but moreover one of the transistors 95 and 97 is then also cut off, so that in this case the line C will carry a high potential. In this way the exclusive-OR function is realized.

What is claimed is:

1. A method of testing an integrated circuit which generates at least one digital output signal comprising the steps of:
   connecting an integrated circuit device of said integrated circuit to a first stage of an output circuit,
   connecting said first stage of said output circuit to a logic circuit and to an output stage of said output circuit, said logic circuit evaluating a combination of signal conditions and said logic circuit controlling a test mode,
   connecting said logic circuit to a test control circuit, said test control circuit causing said integrated circuit device to be switched to said test mode upon application of a signal pattern, and
   applying said signal pattern to said output stage to set said test mode, said signal pattern being complementary to a time signal pattern to be generated.

2. An arrangement for carrying out a method of testing an integrated circuit which generates at least one digital output signal comprising:
   first means for connecting an integrated circuit device of said integrated circuit to a first stage of an output circuit,
   second means for connecting said first stage of said output circuit to a logic circuit and to an output stage of said output circuit, said logic circuit evaluating a combination of signal conditions and said logic circuit controlling a test mode,
   third means for connecting said logic circuit to a test control circuit, said test control circuit switching said integrated circuit device to said test mode upon application of a signal pattern, and
   fourth means for applying said signal pattern to said output stage to set said test mode, said signal pattern being complementary to a time signal pattern to be generated,
   wherein said logic circuit is an exclusive OR-gate having an output connected to a control input of said test control circuit.

3. An arrangement according to claim 2, wherein said output circuit is a non-inverting circuit stage, and said test control circuit is set to said test mode by a logic 0 on said control input by said logic circuit.

4. An arrangement according to claim 2, wherein said output circuit is an inverting stage, and said test control circuit is set to said test mode by a logic 1 on said control input by said logic circuit.

5. An arrangement according to one of claims 2, 3 or 4, wherein said test control circuit includes a bistable multivibrator which is controlled by the signal on said control input.

* * * * *